US011943900B2

(12) United States Patent
Gao

(10) Patent No.: US 11,943,900 B2
(45) Date of Patent: Mar. 26, 2024

(54) LIQUID COOLING SERVER DEPLOYMENT AND DELIVERY APPARATUS AND OPERATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 106 days.

(21) Appl. No.: 17/448,611

(22) Filed: Sep. 23, 2021

(65) Prior Publication Data
US 2023/0088329 A1 Mar. 23, 2023

(51) Int. Cl.
H05K 7/20 (2006.01)

(52) U.S. Cl.
CPC ..... *H05K 7/20663* (2013.01); *H05K 7/20327* (2013.01); *H05K 7/20372* (2013.01); *F25B 2345/00* (2013.01); *F25B 2345/006* (2013.01); *H05K 7/20318* (2013.01); *H05K 7/20354* (2013.01)

(58) Field of Classification Search
CPC ........... F25B 2345/00; F25B 2345/006; H05K 7/20327; H05K 7/20572; H05K 7/20563; H05K 7/20736
See application file for complete search history.

(56) References Cited

U.S. PATENT DOCUMENTS

| 5,680,960 A * | 10/1997 | Keyes ................... G01F 13/006 222/64 |
| 2008/0060368 A1* | 3/2008 | Campbell ................ F25B 23/00 62/149 |
| 2014/0124174 A1* | 5/2014 | Campbell .......... H05K 7/20809 29/890.035 |
| 2020/0093033 A1* | 3/2020 | Lunsman ............. G01M 3/2815 |
| 2021/0389028 A1* | 12/2021 | Smith ..................... F25B 49/02 |

* cited by examiner

*Primary Examiner* — David J Teitelbaum
(74) *Attorney, Agent, or Firm* — WOMBLE BOND DICKINSON (US) LLP

(57) ABSTRACT

A fluid deployment unit includes an expandable container containing mixed fluids in a gaseous region and a liquid region, where the expandable container includes a gas-out port, a liquid-out port, a gas-in port, and a liquid-in port. The fluid deployment unit includes a first three-way valve having a first port coupled to the liquid-out port, a second port coupled to the gas-out port, and a third port matable to an inlet of an electronic rack. The fluid deployment unit includes a second three-way valve having a first port matable to an input port of a liquid-to-liquid exchange unit of a testing assistant unit, a second port coupled to the gas-in port, and a third port matable to an outlet of the electronic rack, where the liquid-in port of the expandable container is matable to an output port of the liquid-to-liquid exchange unit.

21 Claims, 12 Drawing Sheets

LIQUID COOLING SERVER DEPLOYMENT AND DELIVERY APPARATUS AND OPERATION

FIELD OF THE INVENTION

Embodiments of the present invention relate generally to server and data center cooling. More particularly, embodiments of the invention relate to liquid cooling server deployment and delivery apparatus and operation.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying more high-power density electronic racks, where more high-density chips are packaged closer together to provide more computing power and low communication overhead. Cooling these high-density racks by maintaining a proper thermal environment may be an issue with existing cooling systems, such as any air cooling based system.

Liquid cooling, on the other hand, which involves passing a cooling liquid through heat sinks of server electronics is a feasible solution for high-density electronics. Implementing liquid cooling in existing data centers, however, has challenges. For example, there lacks an end to end system and method for delivery and deployment of liquid cooling servers at scale.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
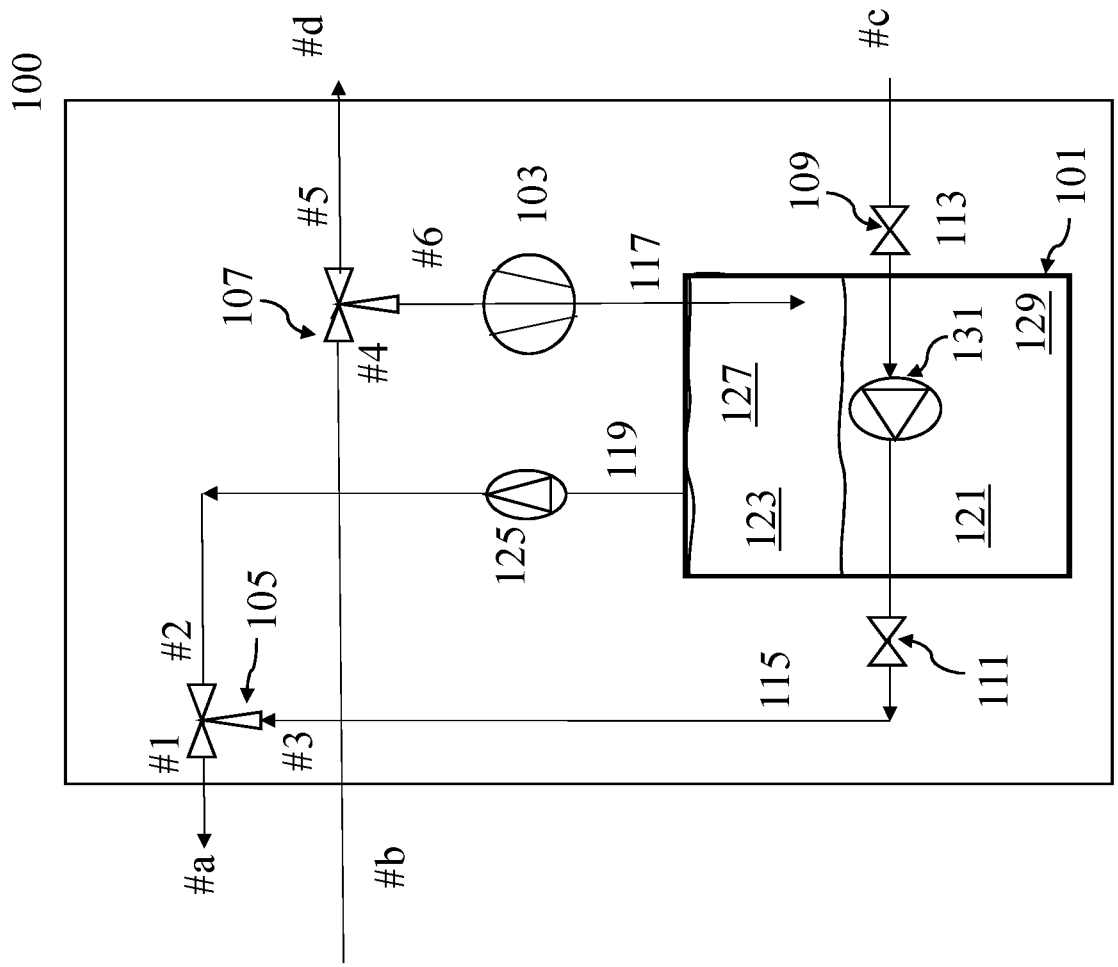
FIG. 1 is a block diagram illustrating a fluid deployment unit according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Existing liquid cooling transportation solutions are mainly developed for individual servers which is not efficient in scale. Embodiments of the current disclosure provides a fluid deployment unit and an end to end solution for large scale server liquid cooling testing, delivery, and/or deployment for data centers.

According to a first aspect, a fluid deployment unit includes an expandable container containing mixed fluids in a gaseous region and a liquid region, where the expandable container includes a gas-out port, a liquid-out port, a gas-in port, and a liquid-in port, where at least the gaseous region is designed so that a volume can be expanded. The fluid deployment unit includes a first three-way valve having a first port coupled to the liquid-out port of the expandable container, a second port coupled to the gas-out port of the expandable container, and a third port matable to an inlet of an electronic rack. The fluid deployment unit includes a second three-way valve having a first port matable to an input port of a liquid to liquid exchange unit, a second port coupled to the gas-in port of the expandable container, and a third port matable to an outlet of the electronic rack, where the liquid-in port of the expandable container is matable to an output port of the liquid to liquid exchange unit. The fluid deployment unit can be used for server test, delivery, transport, and/or deployment purposes.

In one embodiment, the fluid deployment unit further includes a first pump coupled between the gas-out port of the expandable container and the first port of the first valve, where the first pump extracts a mixed fluid in gaseous phase from the expandable container.

In one embodiment, the fluid deployment unit further includes a second pump coupled between the gas-in port of the expandable container and the second port of the second valve, where the second pump pumps a mixed fluid in gaseous phase into the expandable container.

In one embodiment, the expandable container includes a number of compartments each containing a mixed fluid in a gaseous region and a liquid region.

In one embodiment, the mixed fluid includes an inert gas and the coolant liquid, where the coolant liquid is used as a two-phase coolant liquid. In one embodiment, the inert gas includes nitrogen gas.

In one embodiment, the expandable container expands in volume when the expandable container is heated and/or pressurized, where the expandable container includes an expandable or collapsible membrane portion and a stainless steel portion.

In one embodiment, the third port of the first three-way valve is matable to a facility inlet line, where the facility inlet line is coupled to inlets of a number of electronic racks.

In one embodiment, the third port of the second three-way valve is matable to a facility outlet line, where the facility outlet line is coupled to outlets of a number of electronic racks.

In one embodiment, the liquid to liquid exchange unit forms a coolant loop with the fluid deployment unit and the liquid to liquid exchange unit includes a compressor/condenser that cools a liquid of the coolant loop.

In one embodiment, the fluid deployment unit is transportable for deployment separate from an electronic rack, where the fluid deployment unit is filled with a coolant liquid and the electronic rack is filled with an inert gas when transported.

In one embodiment, when deploying the electronic rack, inert gas is discharged from the electronic rack to the fluid deployment unit during a first time interval, where a coolant liquid is charged from the fluid deployment unit to the electronic rack during a second time interval, where the inert gas is containable and reusable by the electronic rack and the fluid deployment unit.

In one embodiment, when performing a test for the electronic rack, a coolant liquid recirculates between the electronic rack and a test assistant unit via the fluid deployment unit, wherein the test includes performance, verification, thermal cycle, thermal shock, reliability, functional, and/or acceleration tests.

In one embodiment, when performing a test for the electronic rack, a coolant liquid is discharged from the electronic rack including the servers to the fluid deployment unit during a first time interval, wherein inert gas is charged from the fluid deployment unit to the electronic rack including the servers to a predetermined pressure during a second time interval, wherein the test includes a leakage test to test for a decrease in pressure of the inert gas containable in the one or more servers. This procedure can be used to prepare the racks and servers for transportation to a deployment site.

In one embodiment, when performing a deployment of a number of electronics racks, inert gas is discharged from a first of the electronic racks to the fluid deployment unit during a first time interval, where a cooling liquid is charged from the fluid deployment unit to a second of the electronic racks during a second time interval.

According to a second aspect, a method/system to deploy an electronic rack is disclosed. In response to determining the electronic rack has coolant liquid therein, the system removes the coolant liquid from the electronic rack. The system charges the electronic rack with an inert gas to a predetermined pressure. The system seals the electronic rack with the inert gas at the predetermined pressure, where the electronic rack having the inert gas is transport to a deployment.

FIG. 1 is a block diagram illustrating a fluid deployment unit 100 according to one embodiment. fluid deployment unit (or unit) 100 includes a mix fluid container 101 having two regions 121-123. A first region 123 can contain an inert gas 127, such as a nitrogen gas. A second region 121 can contain a cooling (coolant) liquid 129 to cool server electronics, where the server electronics may or may not be submersed in cooling liquid 129 for cooling.

In one embodiment, cooling liquid 129 includes propylene glycol plus purified or deionized water. In one embodiment, the cooling liquid 129 can operate in a single phase mode. For example, when the cooling liquid operates in the single phase mode, the cooling liquid in liquid phase can be circulated to server electronics in an electronic rack, where, when the server electronics operates, the server electronics generate heat that is transferred to the single phase cooling liquid, where the single phase cooling liquid circulates back to the fluid deployment unit.

In one embodiment, cooling liquid 129 includes a dielectric solution which can operate in a phase change mode (two-phase mode). When a dielectric solution operates in phase change mode, cooling dielectric solution in liquid phase can be circulated to server electronics in an electronic rack, where, when the server electronics operates, the server electronics generate heat that is transferred to the dielectric solution, thereby causing at least some of the dielectric solution to turn into vapor phase. The dielectric solution in vapor phase then returns back to the fluid deployment unit.

In one embodiment, region 121 and/or 123 can be designed with flexible containing material such as a polymer with an expandability factor greater than a predetermined threshold, so that a volume of the regions 121-123 can expand when operating under heat/pressure. For example, container 101 can include a stainless steel tank portion near region 121, and an expandable/collapsible polymer balloon portion near region 123, where the expandable/collapsible polymer balloon portion can expand when pressure increases in container 101.

In one embodiment, region 123 can be coupled to a gas-out line 119 and a gas-in line 117. In one embodiment, region 121 can be coupled to a liquid-out line 115 and liquid-in line 113. In one embodiment, liquid-out line 115 can include two-way valve 111, and liquid-in line 113 can include two-way valve 109. In one embodiment, a pump 131 is coupled between valves 109 and 111. Pump 131 and valves 109-111 can be used to control a liquid flow through container 101. In one embodiment, unit 100 includes a controller (not shown) electrically connected to the pumps and valves of unit 100 to control the operations of pumps and valves of unit 100.

Figure 3:
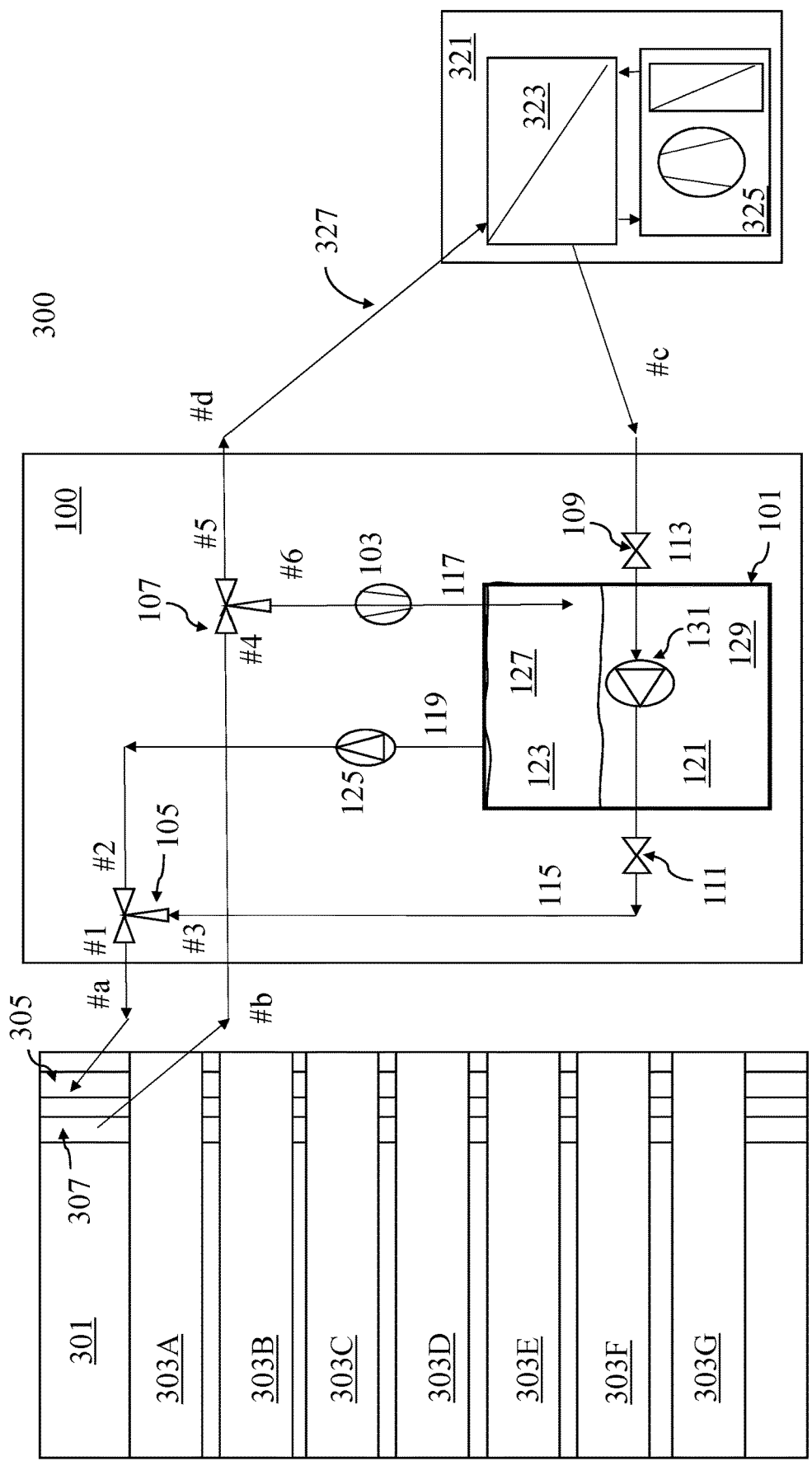
FIG. 3 is a block diagram illustrating a test system according to one embodiment.

In one embodiment, fluid deployment unit 100 can include ports #a, #b, #c, and #d, where ports #a and #b can be connected to an electronic rack, and ports #c and #d can be connected to a testing assistance unit, as further described in FIG. 3.

In one embodiment, the gas-out line 119 and liquid-out line 115 are connected to a three-way valve 105, and three-way valve 105 is connected to port #a of unit 100. For example, valve 105 can include port #1 coupled to port #a, port #2 coupled to gas-out line 119, and port #3 coupled to liquid-out line 115. Port #a is designed to mate to an inlet (supply) of an electronic rack.

In one embodiment, liquid-in line 113 is extended to port #c. The gas-in line 117 is also extended to ports #b and #d through a three-way valve 107. For example, three-way valve 107 can be coupled to gas-in line 117, ports #b, and #d of unit 100. Specifically, valve 107 can include port #4 coupled to port #b, port #5 coupled to port #d, and port #6 coupled to gas-in line 117.

The operations of valve 105 can be as follows. When ports #3→#1 are open, valve 105 charges cooling liquid from liquid region 121 of unit 100 to an electronic rack (shown in FIG. 3) via port #a. When ports #2→#1 are open, valve 105 charges inert (such as nitrogen) gas from gas region 123 of unit 100 to an electronic rack via port #a.

The operations of valve 107 can be as follows. When ports #4→#5 are open, valve 107 can return a cooling liquid from an electronic rack (shown in FIG. 3) at port #b. Thereafter, the cooling liquid is directed to port #d and to a test assistant unit (shown in FIG. 3), where the cooling liquid is circulated from the test assistant unit to region 121 of container 101. When ports #4→#6 are open, valve 107 can return gas from an electronic rack at port #b, directing the gas to gas region 123 of unit 100.

In one embodiment, port #a can mate with an inlet of an electronic rack. In one embodiment, port #b can mate to an outlet of the electronic rack. Port #a and #b can be used to charge a liquid and extract a gas from the electronic rack, or charge a gas and extract a liquid from the electronic rack. In one embodiment, port #c can be coupled to a supply port of a test assistant unit (not shown), such as a cooler, for coolant fluid filling supply, and port #d can be coupled to a return port of the test assistant unit. The test assistant unit can provide a cooling capacity to unit 100 to support various tests (such as thermal and functional tests) provided by unit 100. In another embodiment, port #c and #d of unit 100 can be coupled to a cooler that includes a condenser and compressor, or other type of cooling unit, as further shown in FIG. 3. When unit 100 is coupled to the cooler, cooling liquid of unit 100 can circulate the cooler via port #c and #d for the cooling liquid to be cooled.

Figure 2:
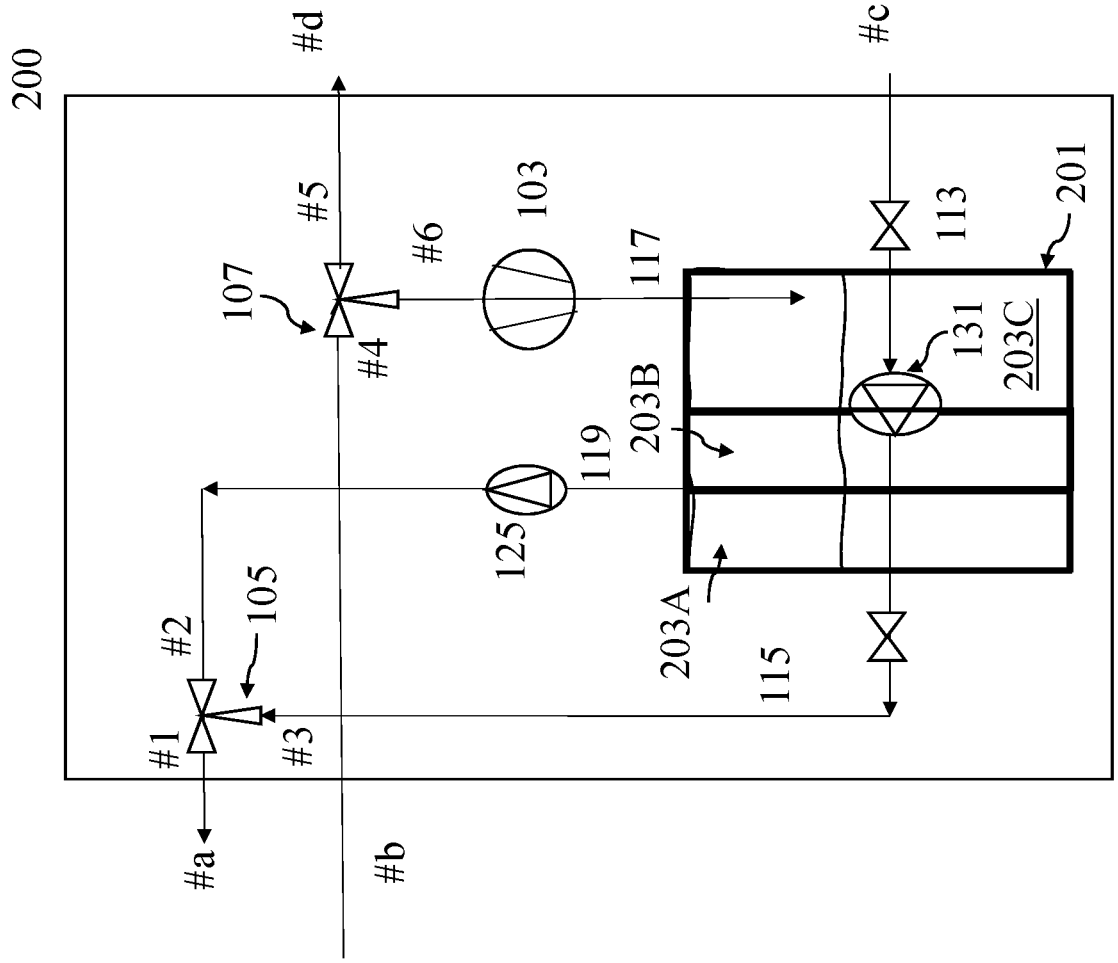
FIG. 2 is a block diagram illustrating a fluid deployment unit according to another embodiment.

FIG. 2 is a block diagram illustrating a fluid deployment unit 200 according to another embodiment. Fluid deployment unit 200 can represent fluid deployment unit 100 of FIG. 1. As shown, unit 200 includes two or more compartments 203A-203C that are contained within container 201. The compartments 203A-203C can be individualized to have different sizes and/or volumes. In one embodiment, each compartment is associated with an electronic rack, where each compartment can include one pair of gas region and liquid region. As described in FIG. 1 with respect to container 101, each compartment can include a stainless steel tank portion and an expandable polymer portion. In one embodiment, unit 200 is equipped with one or more electronic rack(s) during the rack testing, transporting, deployment, and commissioning phases.

FIG. 3 is a block diagram illustrating a test system 300 according to one embodiment. As shown, system 300 can include electronic rack 301, where electronic rack 301 is coupled to a fluid deployment unit 100. Electronic rack 301 can include servers 303A-303G. Each of servers 303A-303G can be coupled to inlet 305 and outlet 307 of rack 301, where inlet 305 supplies servers 303A-303G with a cooling liquid from unit 100, and outlet 307 returns the cooling liquid to unit 100. In one embodiment, each of servers 303A-303G can include either liquid cooling, where cooling liquid circulates through a head exchanger (heat sink) of server electronic, an immersion cooling where server electronics can be immersed in the cooling liquid supplied to servers 303A-303G. For immersion cooling, each individual server can be designed as an independent immersion unit, and the cooling liquid can be a dielectric solution. In one embodiment, servers 303A-303G are liquid cooled and/or air cooled without immersion cooling. In this setup, fluid deployment unit 100 can be coupled to an external cooler 321 only during a rack testing phase.

In one embodiment, servers 303A-303G can be configured to provide information technology (IT) services. Specifically, servers 303A-303G can include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, servers 303A-303G can perform any type of computing task and/or may be any type of computing device (e.g., a server, a storage device, etc.). In one embodiment, servers 303A-303G may be edge computing devices. Thus, while servers 303A-303G provide the IT services, the equipment generates heat that is transferred into a cooling liquid (or phase change fluid).

Fluid deployment unit 100 can function as an intermediate unit between electronic rack 301 and a test assistant unit 321, for intermediate storage of cooling liquid in either gas or liquid phase. It needs to be mentioned that the deployment unit 100 stores both the gas and cooling fluids but fluid deployment unit 100 needs to connect with an external cooling source, such as test assistant unit (or a cooler) 321, for cooling, since unit 100 does not have the capability for cooling according to one embodiment. In one embodiment, test assistant unit 321 includes a liquid-to-liquid heat exchange unit 323 and liquid-to-liquid heat exchange unit 323 can be coupled to refrigerant loop 325. Refrigerant loop 325 can include a compressor and condenser unit. For example, ports #d and #c are coupled to a cooling liquid loop 327 to circulate a liquid for cooling. Cooling liquid loop 327 is coupled to test assistant unit 321, which can be used for cooling the cooling fluid that runs to electronic rack 301 and liquid region 121 of container 101. Test assistant unit 321 includes heat exchange unit 323, used to exchange heat (e.g., cool) for the cooling fluid by extracting the heat to refrigerant loop 325, where the compress and condenser removes the heat. The condenser can be an air cooled or liquid cooled condenser.

In one embodiment, coolant fluid container 101 can also be charged by a facility-based source (not shown). Once supplied or the charging process is completed, valves 105-107 and/or pump 103, 125 can be connected to electronic rack 301 with either inert gas or cooling liquid from coolant fluid container 101 via inlet/outlet 305-307 of the rack.

Figure 4:
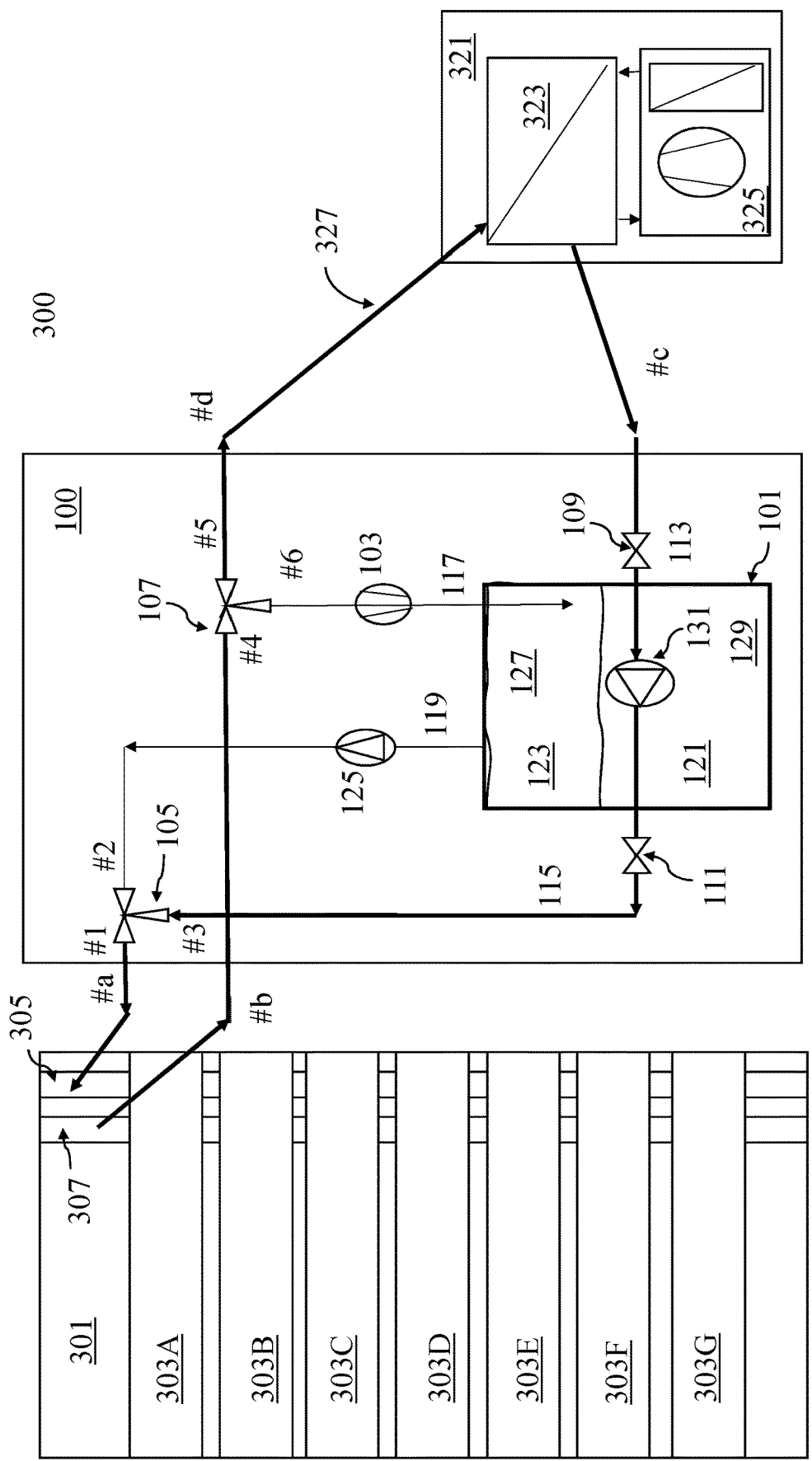
FIG. 4 is a block diagram illustrating cooling fluid circulating at a test system according to one embodiment.

FIG. 4 is a block diagram illustrating cooling fluid circulating at a test system 300 according to one embodiment. As shown, system 300 can provide full cycles of testing for electronic rack 301. The types of tests can include performance, verification, thermal cycle, thermal shock, reliability, functional, acceleration testing, and so on. For example, a cooling fluid is recirculating among the servers via unit 100 and loop 327 to conduct the tests. In this case, valve 105 has ports #1 and #3 open, valve 107 has ports #4 and #5 open, valves 109-111 are open. Pump 131 can charge cooling liquid to flow between servers 303A-303G, unit 100, and condenser 321, via loop 327, inlet 305, and outlet 307. During a test phase, different types of functioning, performance, benchmark, acceleration tests, etc. can be conducted.

Figure 5:
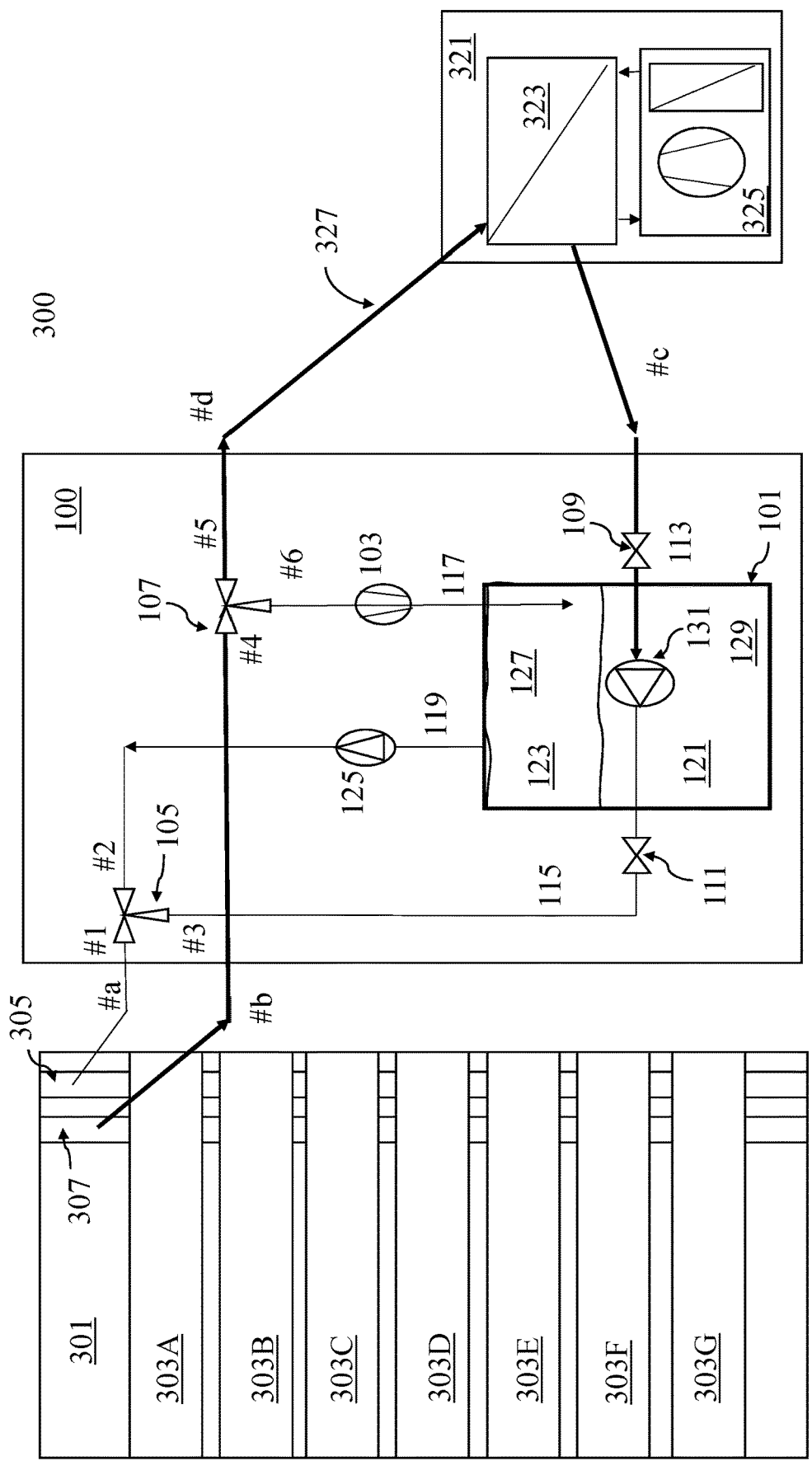
FIG. 5 is a block diagram illustrating a cooling fluid being discharged from an electronic rack to a fluid deployment unit according to one embodiment.

FIG. 5 is a block diagram illustrating a cooling fluid/liquid being discharged from an electronic rack 301 to a fluid deployment unit 100 according to one embodiment. As shown, system 300 can provide a discharge operation for cooling liquid to be discharged from servers 303A-303G to unit 100. In this case, valve 107 has ports #4 and #5 open, valve 109 is open, and valve 111 is closed. Pump 131 can charge cooling liquid to flow from servers 303A-303G to unit 100, via outlet 307. It needs to be mentioned that in order to fully release fluid out of electronic rack, pump 131 can be a high performance pump in an embodiment.

Figure 6:
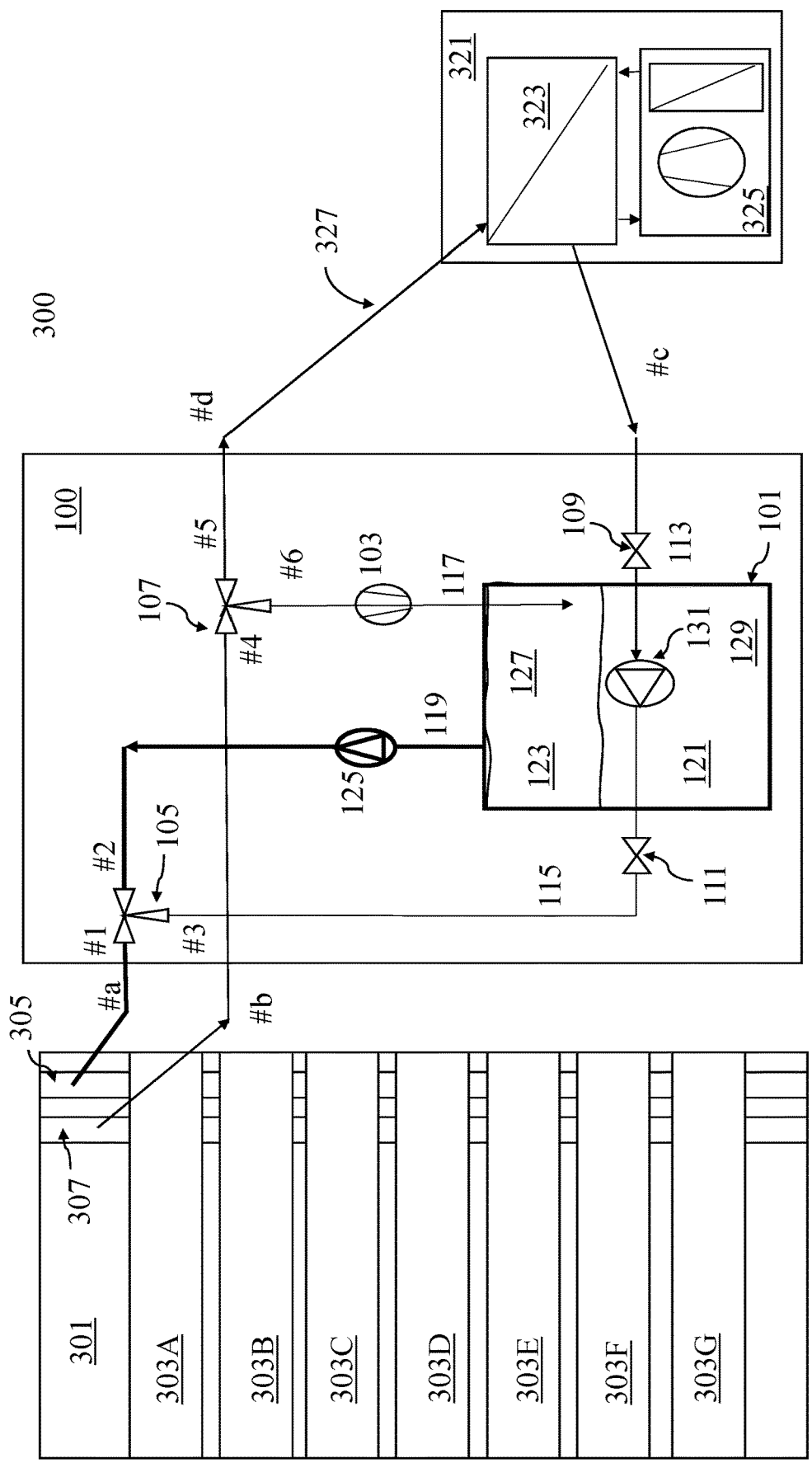
FIG. 6 is a block diagram illustrating a gas being charged from a fluid deployment unit to an electronic rack according to one embodiment.

FIG. 6 is a block diagram illustrating a gas being charged from a fluid deployment unit 100 to an electronic rack 301 according to one embodiment. As shown, FIG. 6 illustrates an inert gas (nitrogen) being charged from unit 100 to electronic rack 301. In one embodiment, once liquid is discharged from servers 303A-303G, valve 105 opens ports #1-#2. Pump 125 then operates to charge nitrogen gas from unit 100 to servers 303A-303G via inlet 305. In one embodiment, a leakage test can be performed for the electronic rack by discharging a coolant liquid from the electronic rack and charging the electronic rack with an inert gas as illustrated by FIGS. 5-6. For example, a coolant liquid is discharged from servers 303 of electronic rack 301 to fluid deployment unit 100 during a first time interval and inert gas is charged from fluid deployment unit 100 to servers 303 of electronic rack 301 to a predetermined pressure during a second time interval. Associated valves (not shown) for servers 303 can keep the pressure contained within servers 303. Thereafter in preparation of the electronic rack shipment, a decrease in pressure (for example via pressure sensor at the servers 303) for any of servers 303 can be verified for gas leakage. In an embodiment, if the servers are not equipped with individual valves, then the pressure can be contained by rack side valves (not shown).

Figure 7:
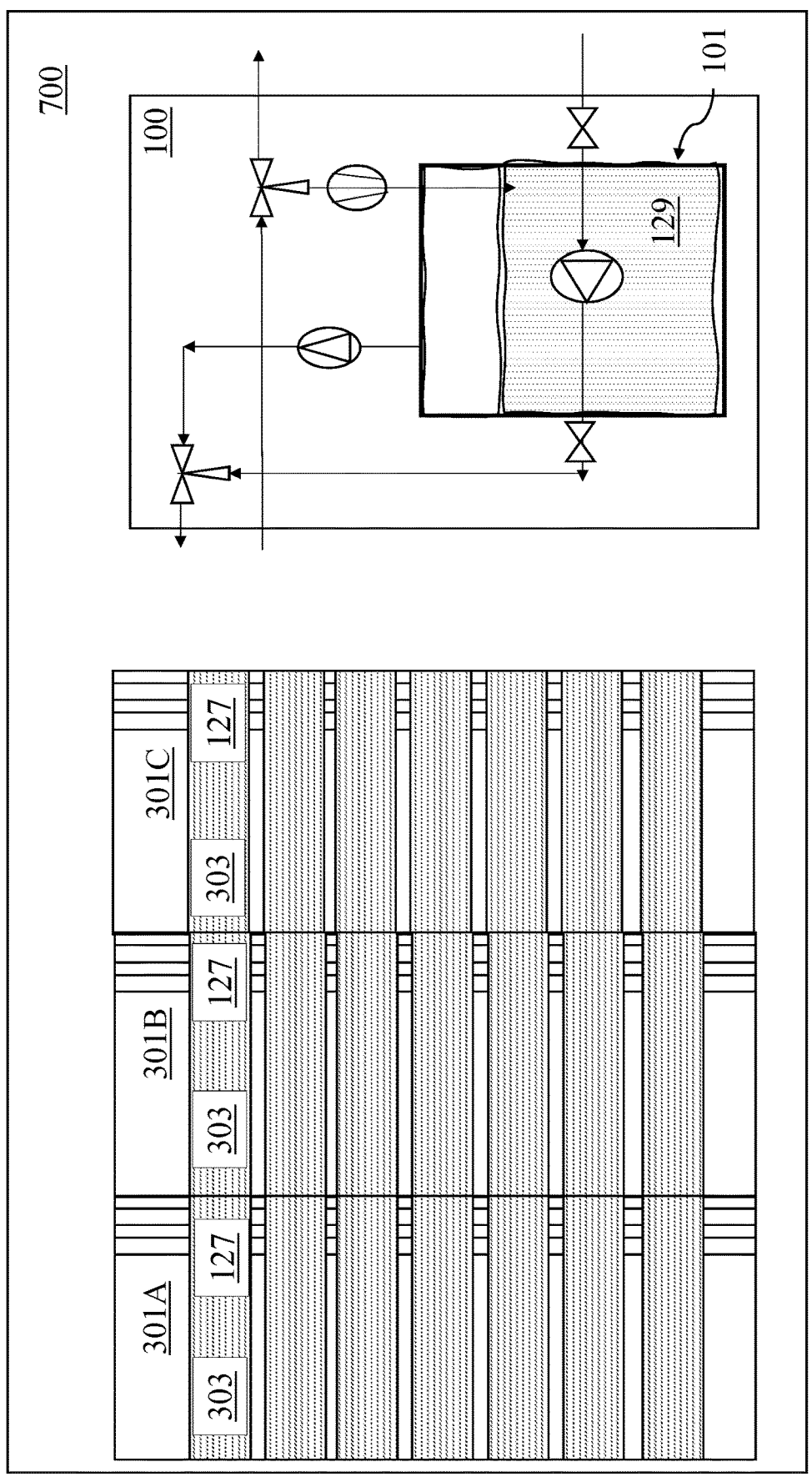
FIG. 7 is a block diagram illustrating a fluid deployment unit and electronic racks in a transportation container according to one embodiment.

FIG. 7 is a block diagram illustrating a fluid deployment unit and electronic racks in a transportation container according to one embodiment. FIG. 7 shows the operation when racks 301 are being transported to a data center in a transportation container 700. In one embodiment, fluid unit 100 is transported together with one or more electronic racks 301A-301C at the same time. In one embodiment, only container 101 is transported with racks 301A-301C. In one embodiment, unit 100 are transported separately from racks 301A-301C. In this case, racks 301A-301C can be transported having servers filled with inert (nitrogen) gas 127, where fluid unit 100 or container 101 can have a nearly empty gas region but with a liquid region filled with cooling fluid 129. In one embodiment, racks 301A-301C and servers therein are pressurized during the transportation. Having the servers 303 of racks 301A-301C filled with inert gas eases transportation of electronic racks 301A-301C. FIG. 7 shows only three electronic racks for the purposes of illustration, however, any other number of electronic racks can be transported by transportation container 700.

Figure 8:
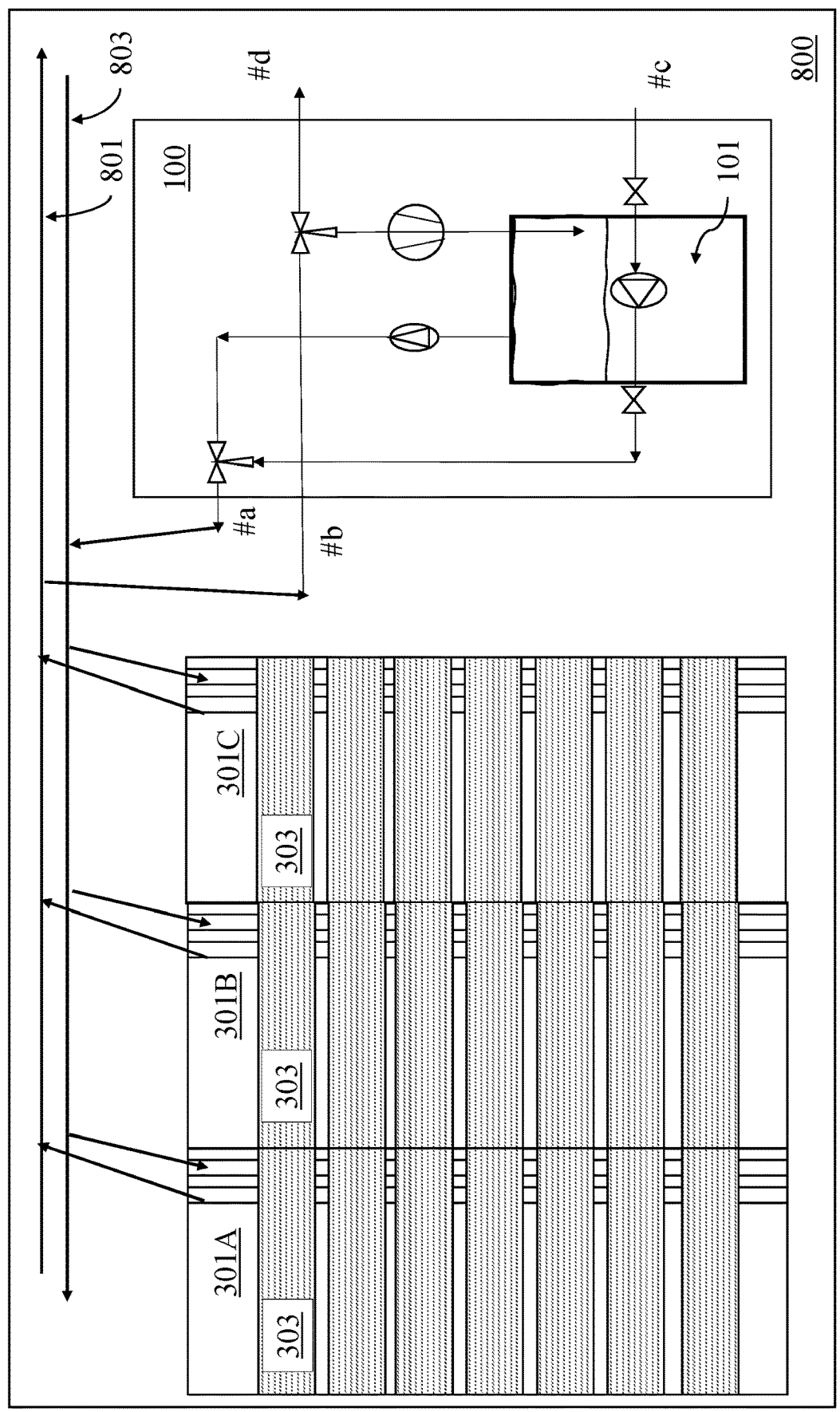
FIG. 8 is a block diagram illustrating a fluid deployment unit and electronic racks at deployment site according to one embodiment.

FIG. 8 is a block diagram illustrating a fluid deployment unit 100 and electronic racks 301A-301C at deployment site 800 according to one embodiment. The deployment site 800 can be a data center facility, a test facility, or an intermediate site. In one embodiment, once racks 301A-301C and servers 303 are delivered to the deployment site, an operator can check a pressure of servers 303 to ensure that there is no leak. Once the racks 301A-301C and fluid deployment unit 100 are delivered, inlets and outlets of racks 301A-301C and ports #a-#b of fluid deployment unit 100 can be mated to a data center fluid loop (fluid lines) 801-803. In one embodiment, servers 303 of electronic racks 301A-301C can be checked for pressure prior to mating to identify if there are any potential leaks.

Figure 9:
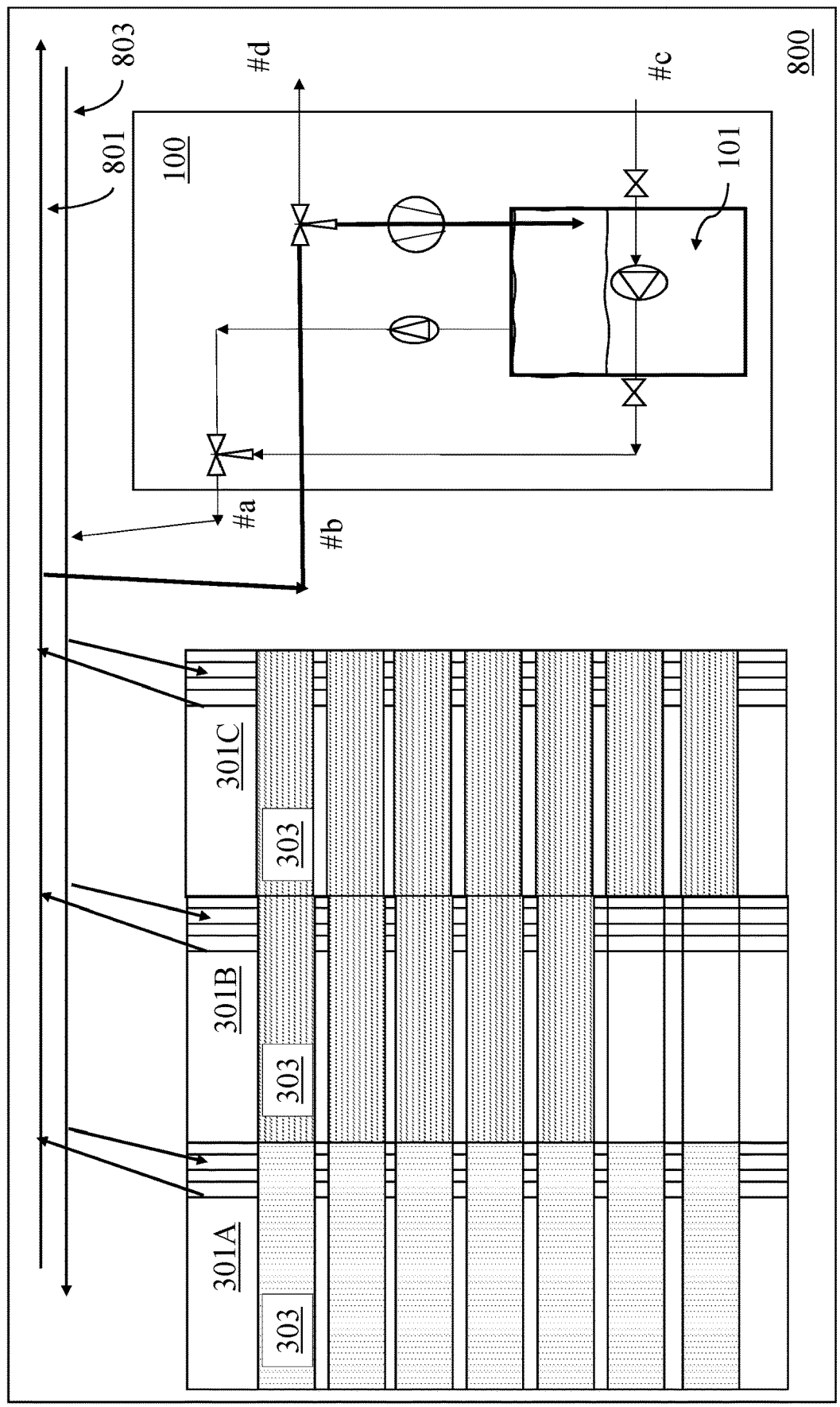
FIG. 9 is a block diagram illustrating electronic racks discharge gas to a fluid deployment unit at deployment site according to one embodiment.

FIG. 9 is a block diagram illustrating electronic racks 301A-301C discharging gas to a fluid deployment unit 100 according to one embodiment. As shown, when electronic racks 301A-301C and fluid deployment unit 100 are mated to fluid loop (fluid lines) 801-803, electronic racks 301A-301C can release inert (nitrogen) gas to fluid deployment unit 100 and electronic racks 301A-301C can be filled with cooling liquid via fluid deployment unit 100, or vice versa, depending on the operations of unit 100. In one embodiment, rack 301A can be charged with cooling liquid at a first time interval. At a second time interval, rack 301B-301C can be discharged of nitrogen gas.

In one embodiment, the operation to discharge electronic racks 301A-301C of nitrogen gas and to fill electronic racks 301A-301C with cooling liquid can be perform one electronic rack at a time. In one embodiment, if a total volume of the inert (nitrogen) gas in container 101 and coolant liquid in container 101 is kept relatively constant, the reduction of the coolant fluid in the container 101 may enable more volume of the nitrogen gas to fill in container 101. For an expandable container 101, filling container 101 with nitrogen gas can expand container 101 for additional storage to store additional nitrogen gas.

Figure 10:
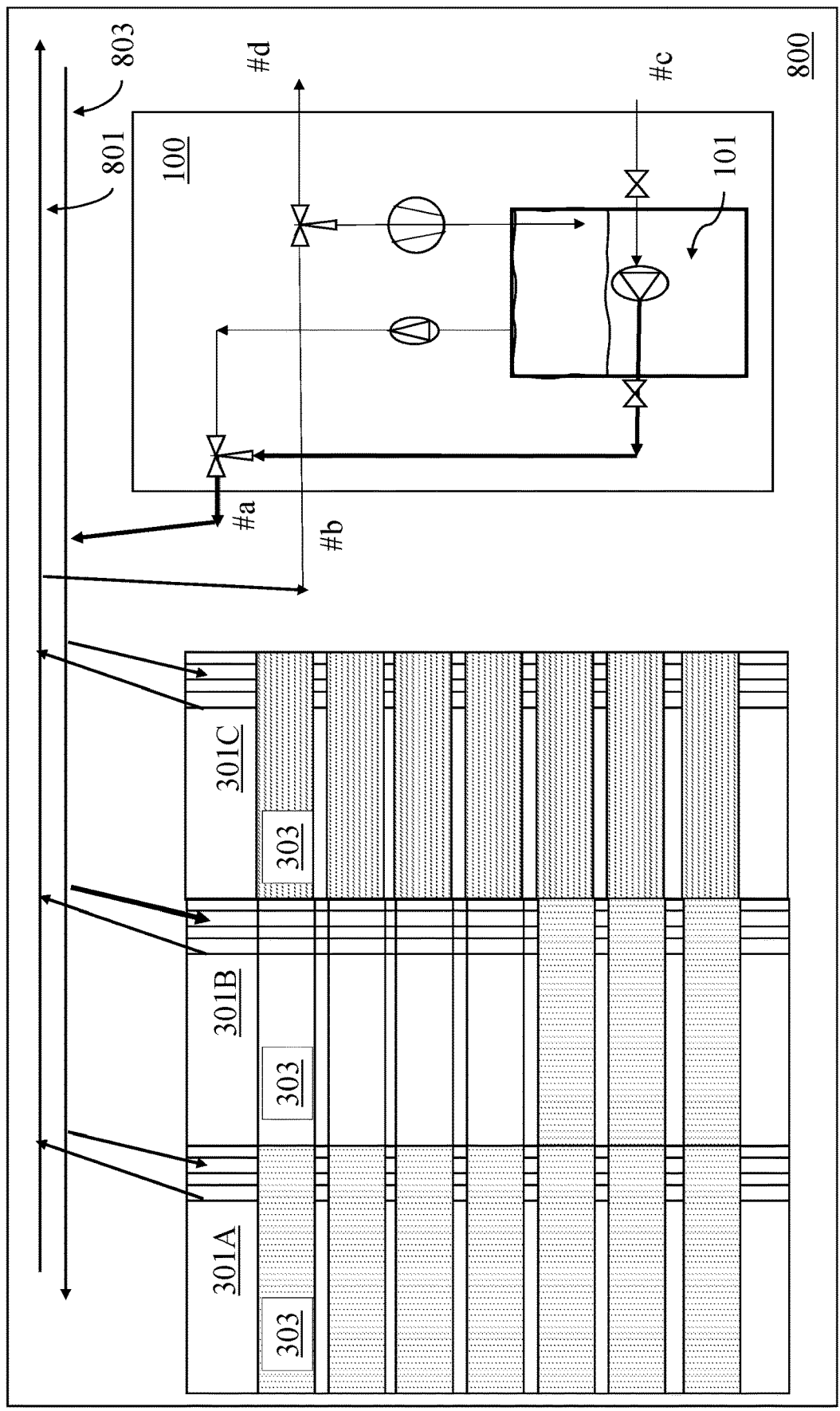
FIG. 10 is a block diagram illustrating a fluid deployment unit charging a cooling liquid to electronic racks at deployment site according to one embodiment.

FIG. 10 is a block diagram illustrating a fluid deployment unit 100 charging a cooling liquid to electronic racks 301A-301C at deployment site 800 according to one embodiment. As shown, unit 100 is charging electronic rack 301B with cooling liquid. It can be seen that charging of rack 301A is complete (rack 301A is ready to begin server operations), while rack 301C is being filled with nitrogen gas. In one embodiment, the connection of racks 301A-301C to facility lines 801-803 can be mated/unmated one by one to prioritize charging/discharging of electronic racks that are in an immediate demand for services. Container 101 of unit 100, in FIGS. 8-10, can include a mixture of liquid and/or gas (not shown), and the mixture can be segregated.

Figure 11:
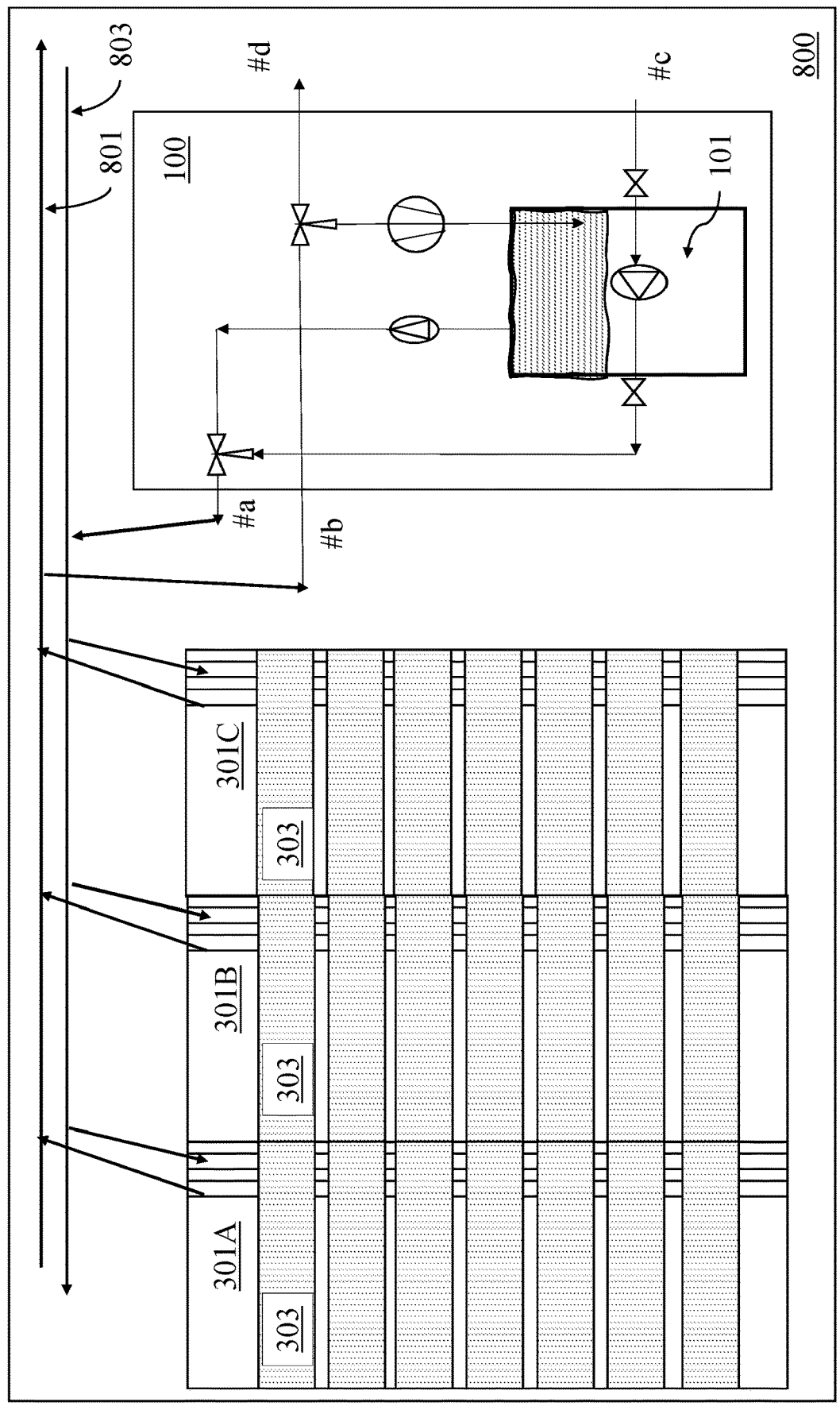
FIG. 11 is a block diagram illustrating a fluid deployment unit charged a cooling liquid to electronic racks at deployment site according to one embodiment.

FIG. 11 is a block diagram illustrating a fluid deployment unit 100 charged a cooling liquid to electronic racks at deployment site 800 according to one embodiment. As shown, racks 301A-301C are filled with cooling liquid, and are ready for services. Here, container 101 can contain the inert gas that are discharged from servers 303 of racks 301A-301C. This way, the inert gas and cooling liquid are containable and reusable by electronic racks 301A-301C and fluid deployment unit 100.

Figure 12:
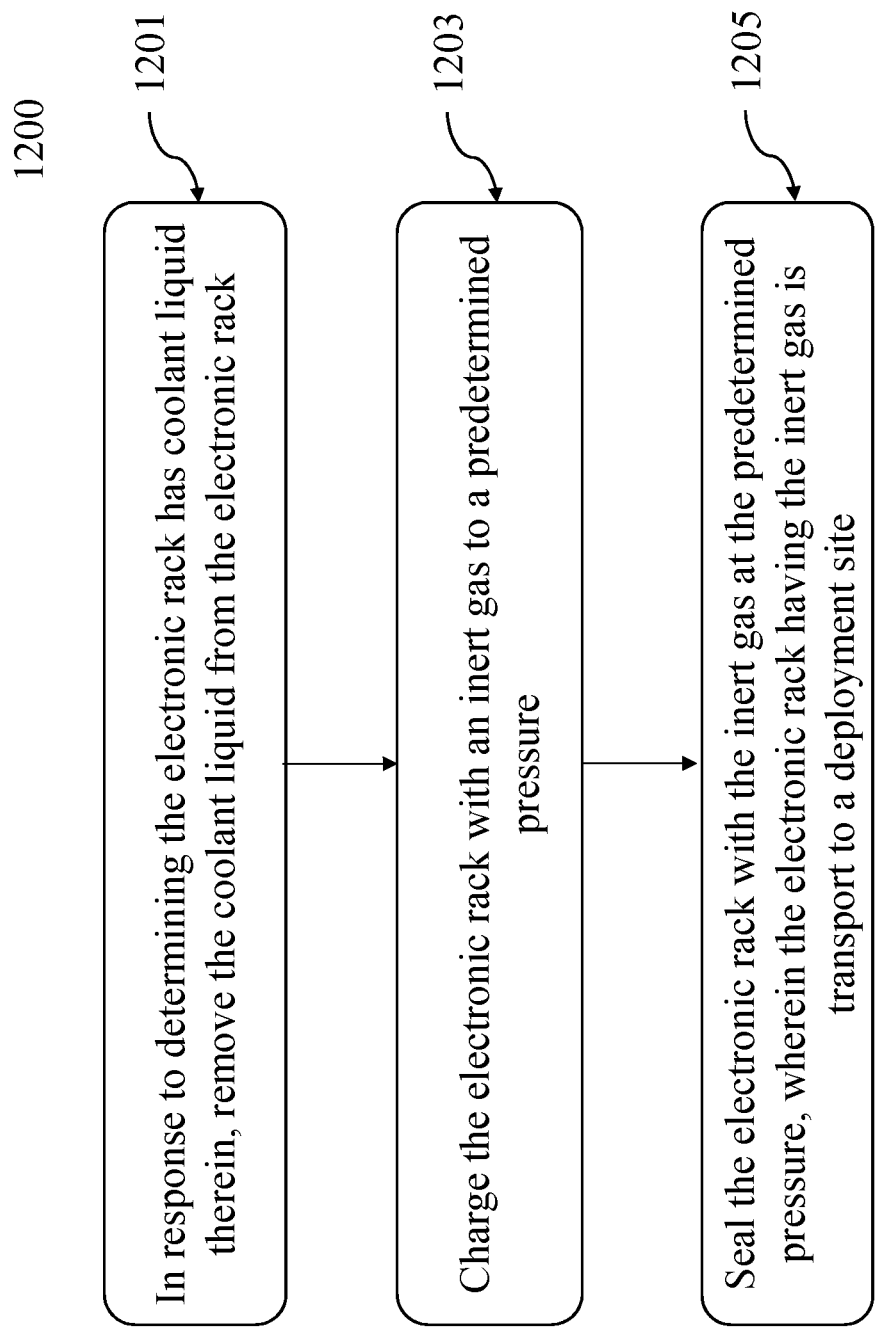
FIG. 12 is a flow diagram illustrating a process to deliver and deploy liquid cooling systems at scale according to one embodiment.

FIG. 12 is a flow diagram illustrating a process 1200 to deliver and deploy liquid cooling systems at scale according to one embodiment. Process 1200 may be performed by processing logic which may include software, hardware, or a combination thereof. For example, process 700 may be performed by unit 100 (or a controller of unit 100) of FIG. 1.

At block 1201, in response to determining an electronic rack has coolant liquid therein, processing logic discharges the coolant liquid from the electronic rack to a fluid deployment unit. For example, as illustrated in FIG. 5, unit 100 coupled to the electronic rack may operate pump 131 to draw liquid from electronic rack 301 via port #b, where valve 107 has ports #4 and #5 open, valve 109 is open, and valve 111 is closed.

At block 1203, processing logic charges the electronic rack with an inert gas to a predetermined pressure. For example, as illustrated in FIG. 6, unit 100 operates pump 125 to charge servers 303 of electronic rack 301 with inert gas, via port #a, where valve 105 has ports #1 and #2 open.

At block 1205, processing logic seals the electronic rack with the inert gas at the predetermined pressure, where the electronic rack having the inert gas is transport to a deployment site. For example, port #a of unit 100 is decoupled from electronic rack 301, where a valve corresponding to servers 303 are closed to prevent inert gas from leaking.

In one embodiment, when at a deployment site, processing logic further discharges the inert gas of the electronic rack to the fluid deployment unit and charges the electronic rack with a coolant liquid from the fluid deployment unit, where the inert gas is containable and reusable by the electronic rack and the fluid deployment unit.

For example, as illustrated in FIGS. 8-11, after transportation, electronic racks 301 are coupled to facility lines 801-803, where a valve corresponding to servers 303 are closed to prevent inert gas from leaking.

In one embodiment, the fluid deployment unit contains mixed fluids in a gaseous region and a liquid region. In one embodiment, the inert gas includes nitrogen gas.

In one embodiment, the fluid deployment unit includes an expandable container and the expandable container includes a number of compartments each containing mixed fluids in a gaseous region and a liquid region.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A fluid deployment unit, comprising:
an expandable container containing mixed fluids in a gaseous region and a liquid region, wherein the expandable container includes a gas-out port, a liquid-out port, a gas-in port, and a liquid-in port;
a first three-way valve having a first port coupled to the liquid-out port of the expandable container, a second port coupled to the gas-out port of the expandable container, and a third port matable to an inlet of an electronic rack; and
a second three-way valve having a first port matable to an input port of a liquid to liquid exchange unit of a cooler unit, a second port coupled to the gas-in port of the expandable container, and a third port matable to an outlet of the electronic rack, wherein the liquid-in port of the expandable container is matable to an output port of the liquid to liquid exchange unit.

2. The fluid deployment unit of claim 1, further comprising a first pump coupled between the gas-out port of the expandable container and the first port of the first valve, wherein the first pump extracts a mixed fluid in gaseous phase from the expandable container.

3. The fluid deployment unit of claim 2, further comprising a second pump coupled between the gas-in port of the expandable container and the second port of the second valve, wherein the second pump pumps a mixed fluid in gaseous phase into the expandable container.

4. The fluid deployment unit of claim 1, wherein the expandable container comprises a plurality of compartments each containing a mixed fluid in a gaseous region and a liquid region.

5. The fluid deployment unit of claim 1, wherein a mixed fluid comprising an inert gas and a coolant liquid, wherein the coolant liquid is used as a two-phase coolant liquid.

6. The fluid deployment unit of claim 5, wherein the inert gas comprises nitrogen gas.

7. The fluid deployment unit of claim 1, wherein the expandable container expands in volume when the expandable container is heated and/or pressurized, wherein the expandable container comprises an expandable membrane portion having an expandability constant above a threshold, and a stainless steel portion.

8. The fluid deployment unit of claim 1, wherein the third port of the first three-way valve is matable to a facility inlet line, wherein the facility inlet line is coupled to inlets of a plurality of the electronic racks.

9. The fluid deployment unit of claim 1, wherein the third port of the second three-way valve is matable to a facility outlet line, wherein the facility outlet line is coupled to outlets of a plurality of the electronic racks.

10. The fluid deployment unit of claim 1, wherein the liquid to liquid exchange unit forms a coolant loop with the fluid deployment unit and the liquid to liquid exchange unit connects to an external cooling source.

11. The fluid deployment unit of claim 1, wherein the fluid deployment unit is transportable for deployment simultaneously with an electronic rack, wherein the fluid deployment unit is filled with a coolant liquid and the electronic rack is filled with an inert gas when transported.

12. The fluid deployment unit of claim 1, wherein, when deploying the electronic rack, inert gas is discharged from the electronic rack to the fluid deployment unit during a first time interval, wherein a coolant liquid is charged from the fluid deployment unit to the electronic rack during a second time interval, wherein the inert gas is containable and reusable by the electronic rack and the fluid deployment unit.

13. The fluid deployment unit of claim 1, wherein, a coolant liquid is circulatable between the electronic rack and a cooler unit via the fluid deployment unit to test the electronic rack, wherein the test includes performance, verification, thermal cycle, thermal shock, reliability, functional, and/or acceleration tests.

14. The fluid deployment unit of claim 1, wherein, a coolant liquid is dischargeable from the electronic rack to the fluid deployment unit, wherein inert gas is chargeable from the fluid deployment unit to the electronic rack to test the electronic rack, wherein the test includes a leakage test to test for a decrease in pressure of the inert gas containable in the electronic rack.

15. The fluid deployment unit of claim 1, wherein, inert gas is dischargeable from a first of the plurality of electronic racks to the fluid deployment unit, wherein a cooling liquid is chargeable from the fluid deployment unit to a second of the plurality of electronic racks.

16. A test system, comprising:
an electronic rack having an inlet and an outlet; and
a fluid deployment unit, comprising:
an expandable container containing mixed fluids in a gaseous region and a liquid region, wherein the expandable container includes a gas-out port, a liquid-out port, a gas-in port, and a liquid-in port;
a first three-way valve having a first port coupled to the liquid-out port of the expandable container, a second port coupled to the gas-out port of the expandable container, and a third port matable to the inlet of the electronic rack; and a second three-way valve having a first port matable to an input port of a liquid to liquid exchange unit of a cooler unit, a second port coupled to the gas-in port of the expandable container, and a third port matable to the outlet of the electronic rack, wherein the liquid-in port of the expandable container is matable to an output port of the liquid to liquid exchange unit.

17. The test system of claim 16, further comprising a first pump coupled between the gas-out port of the expandable container and the first port of the first valve, wherein the first pump extracts a mixed fluid in gaseous phase from the expandable container.

18. The test system of claim 17, further comprising a second pump coupled between the gas-in port of the expandable container and the second port of the second valve, wherein the second pump pumps a mixed fluid in gaseous phase into the expandable container.

19. The test system of claim 16, wherein the expandable container comprises a plurality of compartments each containing a mixed fluid in a gaseous region and a liquid region.

20. The test system of claim 16, wherein the mixed fluid comprising an inert gas and a coolant liquid, wherein the coolant liquid is used as a two-phase coolant liquid.

21. The test system of claim 20, wherein the inert gas comprises nitrogen gas.

\* \* \* \* \*